(12) United States Patent
Van Dijk et al.

(10) Patent No.: US 7,103,829 B2
(45) Date of Patent: *Sep. 5, 2006

(54) CODING FOR INFORMED DECODERS

(75) Inventors: Marten Erik Van Dijk, Eindhoven (NL); Constant Paul Marie Jozef Baggen, Eindhoven (NL); Ludovicus Marinus Gerardus Maria Tolhuizen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 371 days.

This patent is subject to a terminal disclaimer.

(21) Appl. No.: 10/144,529

(22) Filed: May 13, 2002

(65) Prior Publication Data

US 2003/0066014 A1   Apr. 3, 2003

(30) Foreign Application Priority Data

May 16, 2001   (EP) ................... 01201841

(51) Int. Cl.
*H03M 13/00* (2006.01)
(52) U.S. Cl. ..................... 714/777; 714/781
(58) Field of Classification Search ........... 714/774, 714/752, 761, 787, 822, 782, 777, 781; 341/94; 375/40
See application file for complete search history.

(56) References Cited

U.S. PATENT DOCUMENTS

| | | | | |
|---|---|---|---|---|
| 4,541,095 A | * | 9/1985 | Vries | 714/785 |
| 5,051,998 A | | 9/1991 | Murai et al. | 371/39.1 |
| 5,623,504 A | * | 4/1997 | Tolhuizen | 714/755 |
| 5,666,370 A | * | 9/1997 | Ganesan et al. | 714/752 |
| 5,872,798 A | | 2/1999 | Baggen et al. | 371/37.4 |
| 6,301,221 B1 | * | 10/2001 | Paterson | 370/208 |
| 6,487,258 B1 | * | 11/2002 | Jedwab et al. | 375/340 |

OTHER PUBLICATIONS

Van Dijk et al: "Coding for informed decoders," Proceedings. 2001 IEEE International Symposium On Information Theory (IEEE Cat. No. 01CH37252), Jun. 24-29, 2001, p. 202.
"Principles of Digital Audio", K.C. Pohlmann, 2nd Ed., 1991, p. 207.

* cited by examiner

*Primary Examiner*—Guy Lamarre
*Assistant Examiner*—Mujtaba K. Chaudry
(74) *Attorney, Agent, or Firm*—Edward W. Goodman

(57) ABSTRACT

A method of selecting a generator matrix (G) for encoding information words (m) including information symbols ($m_1$, $m_2$, $m_k$) into codewords (c) of a code (C) provides an enhanced error correction capability if at least one information symbol ($m_1$, $m_2$, $m_3$) is known a priori to a decoder decoding received, possibly mutilated codewords (r). In order to design a code of which the correction power is enhanced if some information symbols are known to the decoder prior to decoding, the generator matrix (G) is selected such that the minimum Hamming distance of at least one subcode (C') of the code (C) is larger than the minimum Hamming distance of the code (C), and that a subcode generator matrix (G') of the at least one subcode (C') is derived from the generator matrix (G) of the code (C) by omitting the at least one row from the generator matrix (G) corresponding to the at least one a priori known information symbol ($m_1$, $m_2$, $m_3$).

28 Claims, 8 Drawing Sheets

CODING FOR INFORMED DECODERS

BACKGROUND OF THE INVENTION

1. Field of the Invention

The invention relates to a method of selecting a generator matrix for encoding information words, comprising information symbols, into codewords of a code for providing an enhanced error correction capability if at least one information symbol is known a priori to a decoder decoding received, possibly mutilated, codewords. The invention relates further to a method of encoding information words into codewords, and to a method of decoding possibly mutilated codewords of a code into information words. Still further, the invention relates to a corresponding apparatus for encoding information words, to a corresponding apparatus for decoding possibly mutilated codewords, to a computer program implementing said methods, to a data carrier for recording user data and to a signal for transmitting user data.

2. Description of the Related Art

The concept of using a generator matrix for encoding information words into codewords is widely used and known, e.g., from Richard E. Blahut "Theory and Practice of Error-Control Codes", Addison Wesley, May 1984, Sec. 3.2. Such a generator matrix is particularly used and described in standards, like the CD audio standard.

As a particular example for the use of a systematic algebraic code for the protection of information against errors, in the field of address retrieval on optical media, the sector address on optical media is part of a header which is protected by an error correcting code. Under many circumstances, e.g., if consecutive sectors are to be written or read, or in case of an enforced track jump to an approximately known disk area, much of the header information of the current sector can be inferred from the previously read sectors and the table of contents. However, for known codes, partial knowledge of information symbols hardly leads to an improved error correction capacity of the code.

SUMMARY OF THE INVENTION

The present invention therefore relates to coding for a channel producing symbol errors, where a side-channel which is not known to the encoder possibly informs the decoder about a part of the information that is encoded in the transmitted codeword. It is an object of the present invention to design a code for which the error correction power is enhanced if some information symbols are known to the decoder prior to decoding. It is a further object of the present invention, to provide a method of encoding information words into codewords and a method of decoding a possibly mutilated codeword encoded by such a method of encoding. Further, corresponding apparatuses shall be provided.

These objects are achieved by a method of selecting a generator matrix, according to which said generator matrix is selected such that the minimum Hamming distance of at least one subcode of said code is larger than the minimum Hamming distance of said code, and that a subcode generator matrix of said subcode is derived from said generator matrix of said code by omitting the at least one row from said generator matrix corresponding to said at least one a priori known information symbol. These objects are further achieved by a method of encoding, and a method of decoding.

According to the present invention, the mapping of information words onto codewords is such that the decoder can enhance the effective Hamming distance if some information symbols of the information words are known. However, it is assumed that the decoder is not informed about which, if any, symbols are actually known to the decoder. To get such an enhancement of the effective Hamming distance, a certain predefined (i.e., previously selected) generator matrix is used. Said predefined generator matrix is then used for encoding and decoding, i.e., it needs to be used as a standard generator matrix. In other words, the generator matrix is selected such that the minimum Hamming distance of a subcode is larger than the minimum Hamming distance of the complete code.

When using said predefined generator matrix, address information can be protected more reliably. If part of the address information, e.g., the most significant bits, is already known to the decoder, if a new command to access a certain address on a data carrier, e.g., a disk, is given, address retrieval is more reliable, which is especially important during writing. The decoder can then effectively use a subcode having an increased minimum Hamming distance. However, if no information symbols are known to the decoder a priori, decoding of the retrieved codeword is possible, as usual, and the Hamming distance of the code used according to the invention will be the same as the Hamming distance of known codes, i.e., no subcode with a larger minimum Hamming distance can be used during decoding.

When receiving a possibly mutilated codeword, e.g., by reading it from a data carrier, and in the case where at least one information symbol is known to the decoder a priori, e.g., the most significant bits of a read address, the decoder first encodes the known information symbols by using the corresponding rows of said generator matrix which has already been used to encode the corresponding information word of said information symbols into a codeword, and then adds the result giving an intermediate word. Such intermediate word is thereafter subtracted from the received codeword which is to be decoded. The result is then decoded by a known decoding method using a subcode generator matrix comprising only that part of the generator matrix used for encoding the information word which corresponds to the unknown information symbols, i.e., from the generator matrix used for encoding, the rows corresponding to the information symbols known a priori to the decoder are omitted, and the decoder only uses the remaining rows of the generator matrix as a subcode generator matrix for decoding the result of said subtraction. This means that in the subcode generator matrix, only the rows of the generator matrix appear that do not correspond to the a priori known information symbols.

When selecting the generator matrix as described above, the error correction power can be enhanced if some information symbols are known to the decoder prior to decoding. There may be different levels of improvement depending on which and how many information symbols are known to the decoder.

According to a preferred embodiment of the invention, the generator matrix of the code comprises at least two subcode generator matrices all having different numbers of rows, wherein all rows of such subcode generator matrices are part of said generator matrix, i.e., the subcodes deriving from said subcode generator matrices are nested in said code deriving from said generator matrix. Each row of the generator matrix can also be regarded as representing a polynomial each having a certain number of zeros. According to the present embodiment, certain zeros are common to each polynomial, i.e., to each polynomial represented by one row of the generator matrix. However, each polynomial differs from each other polynomial in at least one zero. With this embodiment, it can be achieved that the Hamming distance increases with the number of information symbols known a priori to the decoder.

The generator matrix may also be selected such that its error correction capacity increases with an increasing number of information symbols which are a priori known to the decoder. The generator matrix may further be selected such that the Hamming distance of all proper subcodes of said code generated by some, but not all, rows of the generator matrix is larger than the Hamming distance of said code. This has the advantage that, already in the case where one information symbol is known a priori to the decoder, the code has an improved error correction capacity no matter which information symbol is known a priori.

The method for decoding a possibly mutilated codeword according to the invention is generally characterized in that said information words are encoded into said codewords using a generator matrix selected according to the invention and that the contribution of said at least one a priori known information symbol included in said possibly mutilated codeword is taken into account for decoding said possibly mutilated codeword with enhanced error correcting capabilities. In a preferred embodiment, the contribution of said at least one a priori known information symbol included in said possibly mutilated codeword, is subtracted from said possibly mutilated codeword before decoding said possibly mutilated codeword.

A preferred embodiment of the invention is based on code puncturing. Therein, a larger intermediate generator matrix is used to encode the information words into intermediate codewords having a greater length than codewords encoded using the normal generator matrix. From these intermediate codewords, however, some symbols are omitted to obtain the final codewords. During decoding, a received possibly mutilated codeword is first extended by use of the a priori known information symbols to obtain a pseudo codeword which is then decoded using said intermediate generator matrix used during encoding. The obtained second pseudo codeword is thereafter input into an error and erasure decoder, preferably of a known construction, retrieving the information word.

One main advantage of this embodiment is that a larger minimum Hamming distance can be achieved irrespective if the information symbols known a priori are known in a successive order or not. Even if the information symbols are not known successively, the minimum Hamming distance of a subcode can be increased by each additional known information symbol if the generator matrix is selected and used according to this embodiment of the invention.

An advantageous application of the present invention lies in the field of address retrieval, in particular on optical media. When using the invention, an address or timing information can be protected by a higher error correction capacity making an address retrieval more secure and accurate. The invention can further be used for securing address information in a serial data stream, which is, for example, transmitted over a transmission line, like a telecommunication system or the Internet. In general, the invention can be used for protecting information by a code having an improved—compared to known codes—error correction capacity if part of the information is known a priori to the decoder.

A data carrier according to the invention is preferably used for storing audio, video or software data, and might of a recordable or rewriteable type, in particular, an optical record carrier like a CD or a DVD. A particular application lies in the field of digital video recording (DVR). Generally, such a data carrier comprises system data items, in particular, system data items of address data, timing data or position data, which are already recorded on the data carrier at the production site of the data carrier and which are already present when an empty data carrier for recording user data is bought. The invention may thus be used for encoding said system data items. However, the invention may as well be used for encoding user data.

Still further, the invention includes a signal for transmitting user data, said signal including system data items, e.g., position, address or timing data, encoded by a method according to the inventions.

BRIEF DESCRIPTION OF THE DRAWINGS

The invention will now be further explained in more detail with reference to the drawings, in which.

DESCRIPTION OF THE PREFERRED EMBODIMENTS

Figure 1:
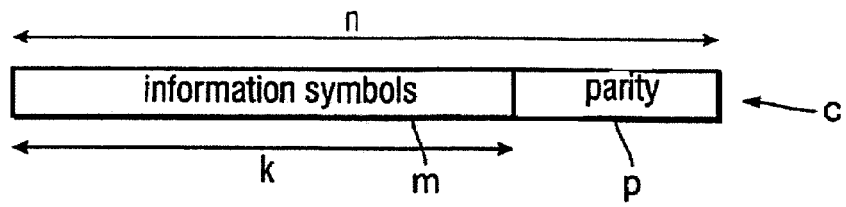
FIG. 1 shows the conventional format of a codeword.

FIG. 1 shows the typical scheme of codewords c of a [n, k] block code, e.g., a Reed-Solomon-Code. A codeword comprises an information word m comprising k information symbols and a parity word p comprising n–k parity symbols generated when encoding said information word m into a codeword c.

Figure 2:
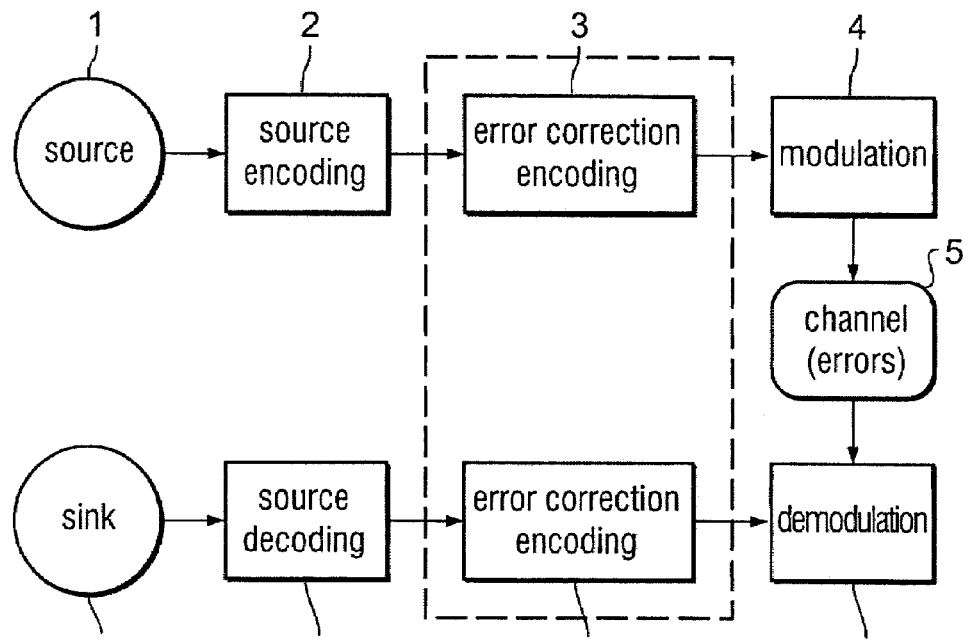
FIG. 2 shows a block diagram of the encoding and decoding scheme.

FIG. 2 shows a block diagram of a typical system using encoding and decoding. Therein, user data, e.g., audio or video data, coming from a data source 1, e.g., recorded on a master tape or master disk, are encoded before they are stored on a data carrier, e.g., a disk, or transmitted over a transmission channel, e.g., over the Internet, before they are again decoded for forwarding to a data sink 9, e.g., for replaying them.

As can be seen, the user data of the source 1 are first encoded by a source encoder 2, then error correction encoded by an ECC encoder 3 and thereafter modulated by a modulator 4, e.g., an EFM modulator, before the encoded user data—the codewords—are put on the channel 5 on which errors may be introduced into the codewords. The channel 5 shall be here interpreted broadly, i.e., including a transmission channel as well as storage of the encoded data on a data carrier for a later replay.

When replay of data is intended, the encoded data first have to be demodulated by a demodulator 6, e.g., an EFM demodulator, after which they are error correction decoded by an ECC decoder 7 and source decoded by a source decoder 8. Finally, the decoded user data can be input to the sink 9, e.g., a player device for replay of the user data.

Such a general system is, however, not only used for encoding and decoding user data, but may as well be used for any kind of data, for example, management data, in particular, address data. Such address data are used to find a certain location on a data carrier or in a data stream of user data. On recordable or rewriteable disks, such address data are generally prerecorded on the empty disks before any user data are recorded.

The present invention refers to encoding and decoding of data. Therein, a certain predetermined generator matrix is used, in which the selection of the generator matrix is also referred to by a method according to the invention. A particular application of the invention lies in the field of address retrieval of addresses used on optical record carriers.

Figure 3:
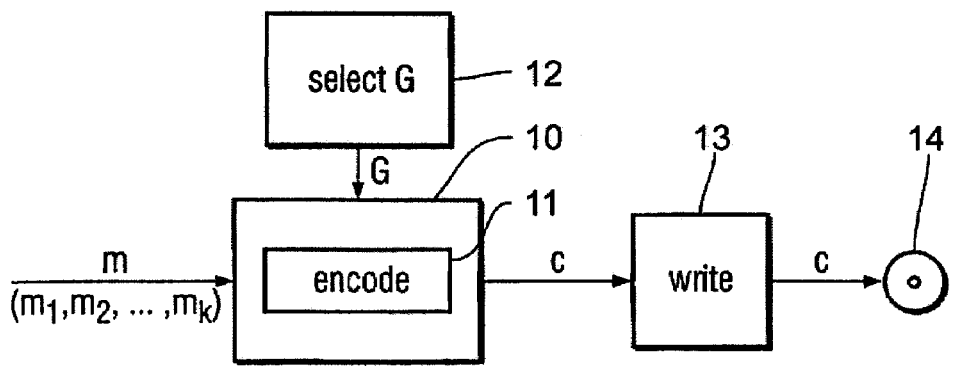
FIG. 3 shows an apparatus for encoding information words according to the invention.

FIG. 3 shows an embodiment of an apparatus for encoding information words m according to the present invention. Therein, the encoding apparatus 10 comprises an encoding unit 11 for encoding the information words m, comprising a fixed number of information symbols $m_1, m_2, \ldots, m_k$, into codewords c of a code C. To achieve an improved error correction capacity, a certain predefined generator matrix G is used for encoding the information words m. This generator matrix G is selected and defined once by a selection unit 12 and then provided or preferably stored in the encoding apparatus 10 and the decoding apparatus for continuous use. By use of the generator matrix G, the information words m are thus encoded into codewords c by the encoding unit 11. These codewords c can be provided to a writing unit 13 for recording the codewords c on an optical record carrier 14, e.g., on a CD or a DVD.

By way of an example, the invention, in particular a preferred selection of the generator matrix G, shall be explained in more detail. The example is based on the [7, 4, 3] binary Hamming code C generated by $g(x)=x^3+x+1$. At first, the "normal" known use of the code shall be explained, while thereafter, the use of a code according to the invention shall be explained.

Usually, a code C is used in systematic form, which corresponds to a generator matrix:

$$G_{sys} = \begin{pmatrix} 1 & 0 & 0 & 0 & 1 & 0 & 1 \\ 0 & 1 & 0 & 0 & 1 & 1 & 1 \\ 0 & 0 & 1 & 0 & 1 & 1 & 0 \\ 0 & 0 & 0 & 1 & 0 & 1 & 1 \end{pmatrix}$$

having four (in general k) rows and seven (in general n) columns. An information word $m=(m_1, m_2, m_3, m_4)$ is mapped onto the codeword $c=m \cdot G_{sys}$. If the i-th information symbol $m_i$ is known to the decoder prior to decoding, the decoder can subtract the contribution of $m_i$ to the received word r prior to decoding. This means that the decoder decodes the residual received word $r-m_i \cdot G_{sys}^i$, where $G_{sys}^i$ indicates the i-th row of $G_{sys}$, to a code where the i-th row is removed from the generator matrix $G_{sys}$. The knowledge of up to any three information bits does not significantly alter the correction capacity for the unknown information bits, since almost all subcodes C' of the code C obtained by deleting at most three rows of $G_{sys}$ still have Hamming distance three. Only if the information bits $m_1, m_3$ and $m_4$ are known, the Hamming distance for retrieving $m_2$ is increased to four.

According to the present invention, another generator matrix $G_{id}$ for the same code C may be given as:

$$G_{id} = \begin{pmatrix} 1 & 1 & 1 & 1 & 1 & 1 & 1 \\ 0 & 1 & 0 & 0 & 1 & 1 & 1 \\ 1 & 1 & 0 & 1 & 0 & 0 & 1 \\ 1 & 1 & 1 & 0 & 1 & 0 & 0 \end{pmatrix} = \begin{pmatrix} g_1 \\ g_2 \\ g_3 \\ g_4 \end{pmatrix}.$$

Figure 4:
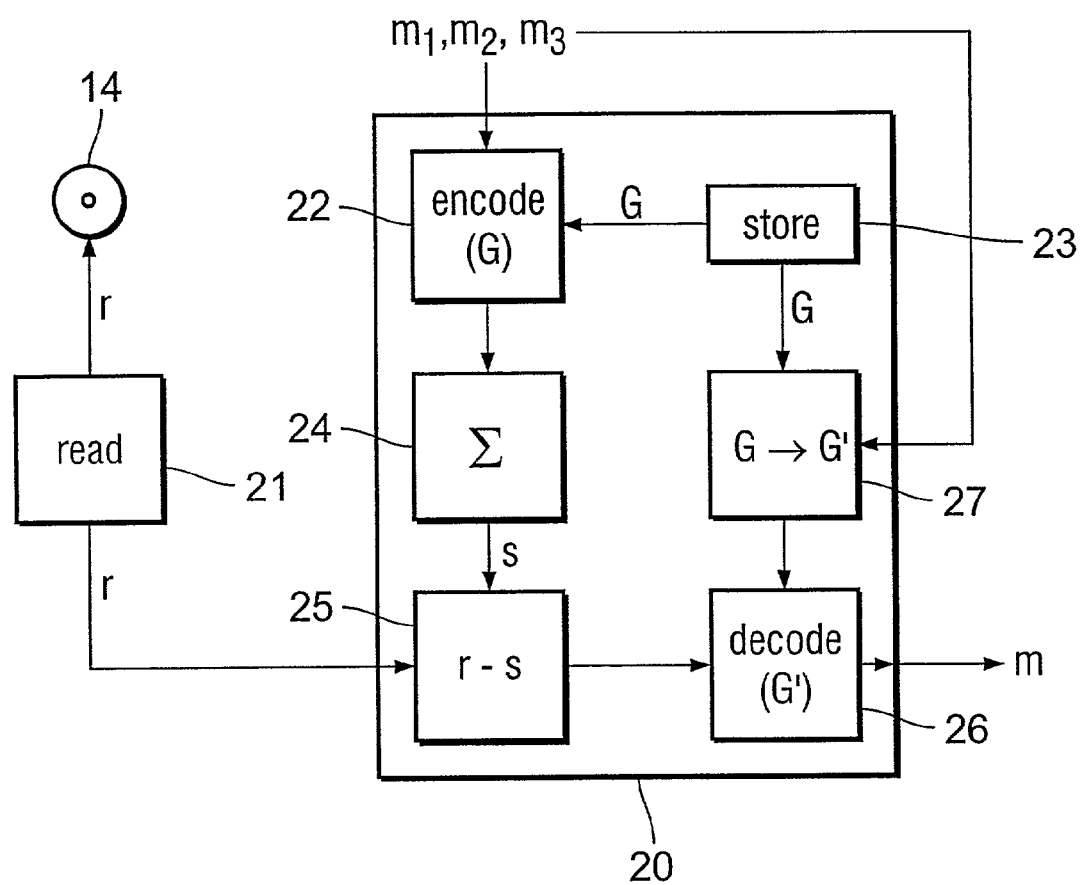
FIG. 4 shows an apparatus for decoding according to the invention.

If the (non-systematic) generator matrix $G_{id}$ is used for the encoding of the code C, an informed decoder, as shown in FIG. 4, can decode to more favorable subcodes C' of the code C if certain information bits or information symbols— an information symbol may comprise more than one bit— are known. For example, if the decoder knows the first information bit $m_1$, it can use the subcode C' generated by the last three rows $g_2, g_3, g_4$ of $G_{id}$, which corresponds to a [7, 3, 4] simplex code. As another example, if the last three bits $m_2, m_3, m_4$ are known to the decoder, it can exploit the subcode generated by the first row of $G_{id}$ which corresponds to the [7, 1, 7] repetition code, thus enabling the decoder to recover $m_1$ reliably even in the presence of three bit errors.

An apparatus for decoding a read, possibly mutilated, codeword r is shown in FIG. 4. Therein, the decoding apparatus 20 receives the possibly mutilated codeword r which has been read from the data carrier 14 by a reading unit 21. Assuming that an information word m encoded in a codeword c comprises four information symbols $m_1, m_2, m_3, m_4$ and assuming further that the apparatus 20 for decoding knows, a priori, three information symbols $m_2, m_3, m_4$, in a first step, said known information symbols $m_2, m_3, m_4$ are encoded by an encoding unit 22 using the generator matrix G which is stored in the encoding apparatus 20 in a storage unit 23 and which had already been used for encoding the codewords c which are stored on the data carrier 14 and read as possibly mutilated codewords r. For such encoding, the encoding unit 22 uses the rows of the generator matrix G which correspond to the known information symbols $m_2, m_3, m_4$.

In a subsequent step, the result of such encoding, i.e., the products of the known information symbols $m_2, m_3, m_4$ with their corresponding rows $g_2, g_3, g_4$ of the generator matrix $G_{id}$, are added by a summing unit 24 forming an intermediate word s. In a subtracting unit 25, the intermediate word s is subtracted from the read codeword r, and the result of such subtraction is provided to a decoding unit 26. Therein, the subcode C', which is generated by using a subcode generator matrix G', is decoded, wherein the subcode generator matrix G' is derived from the generator matrix G in the forming means 27 by omitting all rows from the generator matrix G which correspond to the known information symbols $m_2, m_3, m_4$, i.e., in the present example, by omitting the rows $g_2, g_3, g_4$. Hence, in the present example, the subcode generator matrix G' only comprises the first row $g_1$ of the generator matrix G. As a result, the unknown information symbol $m_1$ can be retrieved such that the complete information word m is finally known. In general, the contribution of said a priori known information symbols included in the possibly mutilated codeword is subtracted from said possibly mutilated codeword, and the result of said subtraction is decoded.

The method of decoding shall now be explained in more detail by way of an example. The codewords c of a code C shall be given by:

$$c = m \cdot G = (m_1\ m_2\ m_3\ m_4)(g_1\ g_2\ g_3\ g_4)^T = m_1 g_1 + m_2 g_2 + m_3 g_3 + m_4 g_4.$$

In general, the generator matrix G comprises k rows and n columns, the information word m comprises k columns and a codeword c comprises n columns.

Assuming now that the information symbols $m_2$, $m_3$, $m_4$ are known a priori to a decoder and that a read codeword r is given by the sum of the stored codeword c plus an additional noise n, the intermediate word s is first computed as:

$$s = m_2 g_2 + m_3 g_3 + m_4 g_4.$$

Thereafter, a difference between the read possibly mutilated codeword r and the intermediate word s is calculated as:

$$r - s = c + n - s = m_1 g_1 + n.$$

Therein, the information symbol $m_1$ can only be 0 or 1 if the information symbol $m_1$ comprises one bit, the row $g_1$ of the generator matrix G is fixed and the noise n is unknown. Using now the above given generator matrix $G_{id}$ selected according to the invention, $g_1$ is given as (1 1 1 1 1 1 1) such that $m_1\ g_1$ can only be (0 0 0 0 0 0 0) or (1 1 1 1 1 1 1). If the before-mentioned calculation of $m_1\ g_1 + n$ has, for example, resulted in (0 0 1 0 0 1 1), the probability will be higher that $m_1\ g_1$ is given as (0 0 0 0 0 0 0) leading to the result that $m_1$ has bit value 0. As can be seen from this example, the information symbol $m_1$ can be determined despite three bit errors in the read codeword, which means that the remaining subcode C' has Hamming distance seven.

The invention can also be illustrated by way of a simple example which may be used for a fast reliable address retrieval. Conventionally, a [7, 4, 3] binary Hamming code is generated by the generator polynomial $g(x) = x^3 + x + 1$. Each codeword is a binary polynomial multiple of the generator polynomial $g(x)$. If a systematic encoder is used, the information bits appear un-altered in the high order positions, while the parity bits are in the low order positions.

Below, a list of all 16 codewords of the code is given wherein the coefficients of each codeword polynomial are given as a vector. The highest order symbol $c_6$ is at the left, while the lowest order symbol $c_0$ is at the right hand side of each codeword. The four left most bits $c_6 \ldots c_3$ correspond to the four information bits $m_4 \ldots m_1$, and the three right most bits $c_2$, $c_1$, $c_0$ are the parity bits $p_3$, $p_2$, $p_1$. By inspection, it can be checked that any two codewords differ in at least three positions, which means that the Hamming distance of the code equals three so that one error can be corrected:

| $c_6$ ($m_4$) | $c_5$ ($m_3$) | $c_4$ ($m_2$) | $c_3$ ($m_1$) | $c_2$ ($p_3$) | $c_1$ ($p_2$) | $c_0$ ($p_1$) |
|---|---|---|---|---|---|---|
| 0 | 0 | 0 | 0 | 0 | 0 | 0 |
| 1 | 0 | 0 | 0 | 1 | 0 | 1 |
| 0 | 1 | 0 | 0 | 1 | 1 | 1 |
| 0 | 0 | 1 | 0 | 1 | 1 | 0 |
| 0 | 0 | 0 | 1 | 0 | 1 | 1 |
| 1 | 1 | 0 | 0 | 0 | 1 | 0 |
| 0 | 1 | 1 | 0 | 0 | 0 | 1 |
| 0 | 0 | 1 | 1 | 1 | 0 | 1 |
| 1 | 0 | 1 | 0 | 0 | 1 | 1 |
| 0 | 1 | 0 | 1 | 1 | 0 | 0 |
| 1 | 0 | 0 | 1 | 1 | 1 | 0 |
| 1 | 1 | 1 | 0 | 1 | 0 | 0 |
| 0 | 1 | 1 | 1 | 0 | 1 | 0 |
| 1 | 0 | 1 | 1 | 0 | 0 | 0 |
| 1 | 1 | 0 | 1 | 0 | 0 | 1 |
| 1 | 1 | 1 | 1 | 1 | 1 | 1 |

As an example, the fifth codeword from the top equals $1 \cdot g(x)$ (in polynomial notation), the fourth codeword from the top equals $x \cdot g(x)$ and the tenth codeword from the top equals $x^2 \cdot g(x)$. It is important to know that the (mod 2) sum of any two codewords is again a codeword, because this is a linear code over GF(2), i.e., the code forms a group. Each information bit is protected against one bit error, and any knowledge about some information bits does not increase the correction capacity of the other information bits.

According to the present invention, the mapping of information bits into codewords is changed such that knowledge about at least one, in the given example of three, information bit increases the correction capacity for the remaining, in the example, the forth, information bits. In the following, the three left-most information bits $m_4$, $m_3$, $m_2$ may be called the MSB (Most Significant Bits) of an address, and the last information bit $m_1$ may be called the LSB (Least Significant Bit) of an address. The code construction according to the present invention is such that if MSB is known, a strong code for extracting LSB is achieved. If none of the information bits is known a priori, the error correction capacity is not changed compared to the error correction capacity of the conventional code.

According to the invention, use is made of the linearity of the code. For the encoding of MSB, simply those systematic codewords in the above table are used that have $m_1 = 0$. It is to be noted that there are indeed 8 of those codewords. If c (MSB) is the result of this encoding, in order to also encode LSB, c (LSB=0)=0000000 and c (LSB=1)=1111111 is chosen. The final codeword c that is transmitted equals c=c (MSB)+c (LSB), where the "+" indicates a vector addition over GF(2). It is to be noted that c again belongs to the code (the table) because of the linearity of the code (over GF(2)). It is further to be noted that the effect of adding c (LSB) to c (MSB) scrambles the value of MSB, i.e., if LSB=1, the values of MSB are inverted. Hence, the overall code is not systematic anymore in all its information bits.

If such a codeword c is transmitted via some channel, bit errors may be introduced in the codeword. A received codeword may thus be mutilated and will be called possibly mutilated codeword r which deviates from the codeword c in the error positions. If nothing is known about the information bits, it is only known that the transmitted codeword c belongs to the Hamming code, so that always one bit error can be corrected. After error correction, which supposedly restores the codeword c from the received word r, the information can be retrieved by first extracting LSB (the information symbol $m_1$) which equals the fourth bit in the codeword c, and with the given LSB either (0 0 0 0 0 0 0) or (1 1 1 1 1 1 1) is subtracted from the codeword c dependent on LSB=0 or LSB=1, respectively. Thereafter, MSB is available as the first three bits of the result. If there is more than one transmission error, there will, however, be made errors in the decoding result which always happens with a single error correction Hamming code.

Suppose, however, that MSB is known before decoding. First, the most significant part c(MSB) of the codeword is reconstructed by the decoder and thereafter subtracted from the received word r. Then either (0 0 0 0 0 0 0) or (1 1 1 1 1 1 1) is left, still corrupted by the channel errors. Because the distance of these two words equals 7, LSB can be found even in the presence of 3 bit errors. Thus, by using only three parity bits for the overall code, LSB is effectively protected by a [7, 1, 7] repetition code if MSB is known. In this example, the [7, 4, 3] Hamming code is divided into a [7, 1, 7] subcode and co-sets of this code.

As already explained, the invention may be used for protecting addresses which are used on optical record carriers. However, the invention may also be used for protecting addresses in any serial data stream which may also be transmitted over a transmission line. In general, the invention may be applied in any application where information words shall be encoded into a code and where an improved error correction capacity shall be achieved if at least one information symbol is known a priori to the decoder.

In more general terms, the invention may be applied to any linear code, in particular, Reed Solomon codes. A [n, k, n−k+1] RS code can be subdivided into multiple subcodes such that if the j most significant information symbols are known, the effective distance for decoding the remaining k−j information symbols equals n−k+1+j. The decoding procedure also consists of re-encoding the j known information symbols, subtracting the result of this re-encoding from the received word, and using the appropriate decoder for decoding the high distance subcode that is left.

In another embodiment of the present invention, the generator matrix G can be selected such that at least two subcodes are nested in the code generated by said generator matrix G. This shall be illustrated by way of the following example. According to the invention, the generator matrix G shall be selected as $G=(g_1(x)\ g_2(x)\ g_3(x))^T$, wherein:

$g_1(x)=(x-1)\ (x-\alpha)\ (x-\alpha^2)\ (x-\alpha^3)=\alpha^6+\alpha^5 x+\alpha^5 x^2+\alpha^2 x^3+x^4$ $g_2(x)=(x-1)\ (x-\alpha)\ (x-\alpha^2)=\alpha^3+\alpha^6 x+\alpha^5 x^2+x^3$ $g_3(x)=(x-1)\ (x-\alpha)=\alpha+\alpha^3 x+x^2$ where $\alpha$ is an element in GF(8) satisfying $\alpha^3=1+\alpha$. The corresponding generator matrix thus results in:

$$G = \begin{pmatrix} \alpha^6 & \alpha^5 & \alpha^5 & \alpha^2 & 1 \\ \alpha^3 & \alpha^6 & \alpha^5 & 1 & 0 \\ \alpha & \alpha^3 & 1 & 0 & 0 \end{pmatrix}.$$

The codewords c(x) of the code C are, therefore, polynomial multiples of the generator polynomial $g_3(x)$. The code C generated by this generator matrix G thus has minimum Hamming distance three as will be clear from the above-mentioned reference of R. Blahut at section 7.2.

Assuming that the information symbol $m_3$ of an information word $m=(m_1\ m_2\ m_3)$ is known a priori to the decoder, the subcode $C_2'$, generated by the corresponding subcode generator matrix $g_2'=(g_1\ g_2)^T$ and having minimum Hamming distance four, can be employed. In such subcode $C_2'$, all codewords are combinations of the generator polynomials $g_1$ and $g_2$.

If the information symbols $m_2$ and $m_3$ are known, the subcode $C_1'$, generated by the subcode generator matrix $G_1'=(g_1)$ and having minimum Hamming distance five, can be employed.

In addition, with the above selection of the generator matrix G, less multiplications are required for the calculation of the codewords c=m·G since some of the generator polynomials are polynomial multiples of other generator polynomials.

As can be seen from the above example, the subcodes $C_1'$ and $C_2'$ are nested in the code C and each subcode $C_1'$, $C_2'$ is generated by a corresponding subcode generator matrix $G_1'$, $G_2'$. Each of said subcode generator matrices $G_1'$, $G_2'$ has a different number of rows wherein all rows are part of said generator matrix G. In general, the selection of G can be such that each subcode generator matrix includes an increasing number of rows and each subcode generator matrix can be achieved from the another subcode generator matrix by omitting one row. In the above example, the subcode generator matrix $G_1'$ is derived from the subcode generator matrix $G_2'$ by omitting the second row, i.e., by deleting the generator polynomial $g_2(x)$. The subcode generator matrix $G_2'$ is derived from the generator matrix G by deleting the last row of G, i.e., by deleting the generator polynomial $g_3(x)$.

The generator matrix G can also be selected such that the first i rows, i being an integer number equal to or larger than 1, form a subcode generator matrix $G_i'$ for obtaining a subcode $C_i'$ wherein the Hamming distance is larger than for a subcode $C_{i+1}'$ obtained from a subcode generator matrix $G_{i+1}'$, which is formed by the first i+1 rows of said generator matrix G.

In more general terms, the code C can be an [n≤q−1, k, n−k+1] RS code over GF(q) with generator polynomial:

$$g_k(x) = \prod_{0 \leq j \leq n-k-1} (x - \alpha^j)$$

wherein $\alpha$ is a primitive element in GF(q). The codewords of the code C are represented by polynomials c(x) of degree, at most, n−1 which are polynomial multiples of the generator polynomial $g_k(x)$. According to the invention, it is proposed to encode the information symbols $m_0, m_1, \ldots, m_{k-1}$ into:

$c(x)=m_0 \cdot g_1(x)+m_1 \cdot g_2(x)+ \ldots +m_{k-1} \cdot g_k(x)$.

The information word m is thus encoded with a generator matrix G for which the j-th row consists of the coefficients of the polynomial $g_j(x)$. The w top rows of the generator matrix G represent the polynomials $g_1(x), g_2(x), \ldots, g_w(x)$, all of which are multiples of $g_w(x)$. Consequently, these top w rows generate an [n, w, n−w+1] residual code. Hence, if the decoder is informed about $(m_w, \ldots, m_{k-1})$, then it can correct up to 0.5 (n−w) errors, using a decoder for the RS code with generator polynomial $g_w(x)$. It is to be noted that the residual codes for consecutive w's are nested subcodes of the original RS code C.

Another efficient encoding method consists of the following steps. At first, the first codeword parameter $c^1(x)$ is initialized by $c^1(x)=m_1$. Thereafter, for j=2 to k, the subsequent codeword parameters $c^j(x)$ are computed by:

$c^j(x)=m_j+(x-\alpha^{n-j})c^{j-1}(x)$.

Finally, the codeword polynomial c(x) is computed by:

$$c(x) = c^k(x) \cdot g_k(x) = \sum_{0 \le i \le n-1} c_i x^i.$$

The coefficients of said codeword polynomial c(x) together form the codeword $c=(c_0, \ldots, c_{n-1})$ in the code C.

Figure 5:
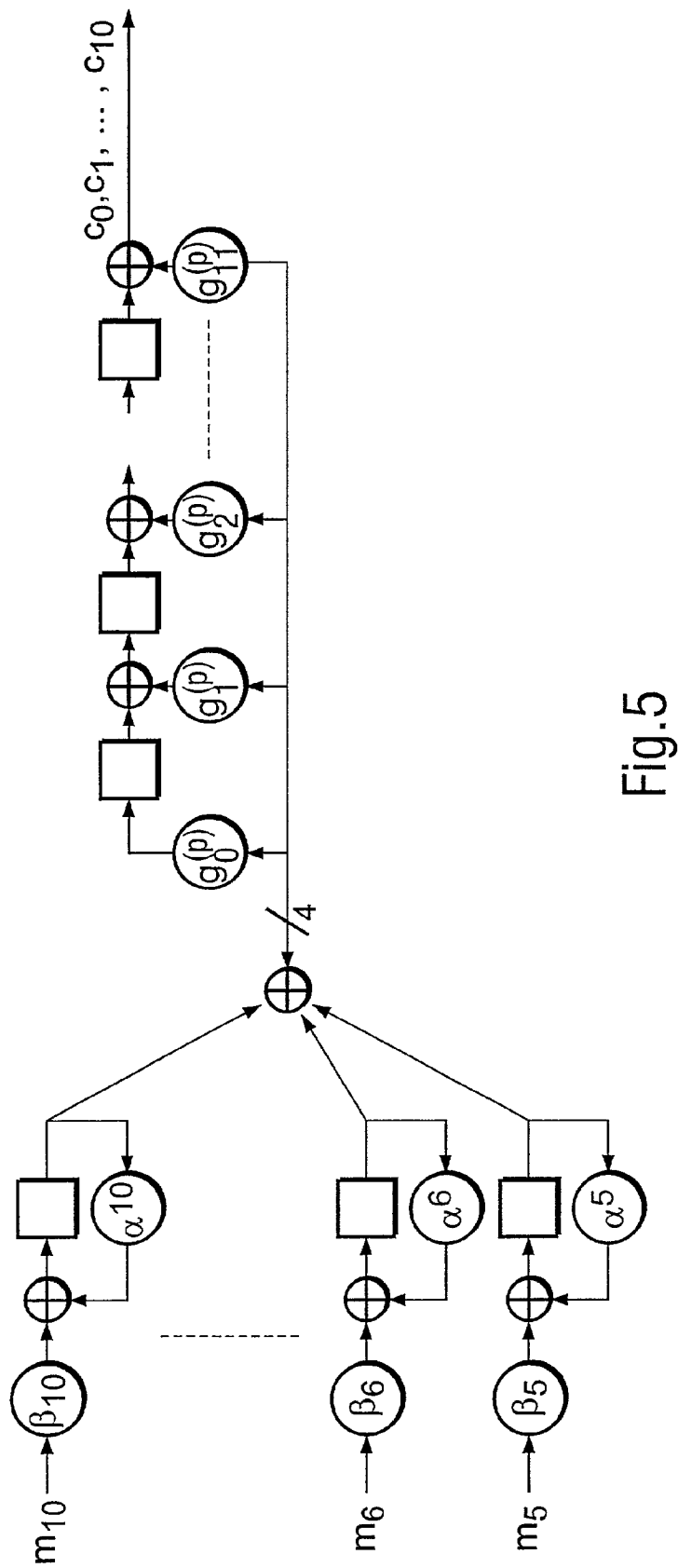
FIG. 5 shows another embodiment of an apparatus for encoding according to the invention.
Figure 6:
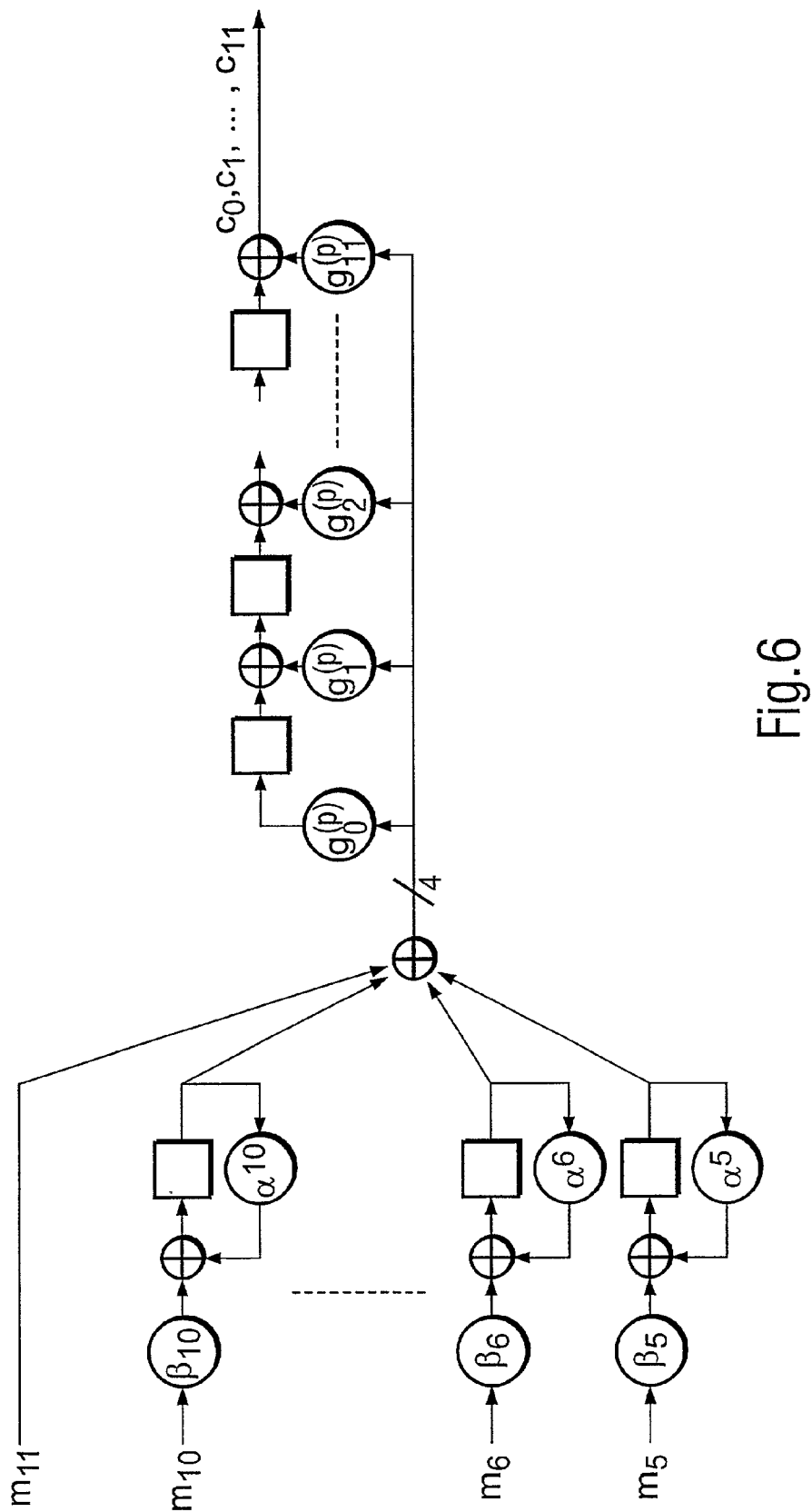
FIG. 6 shows still another embodiment of an apparatus for encoding according to the invention.
Figure 7:
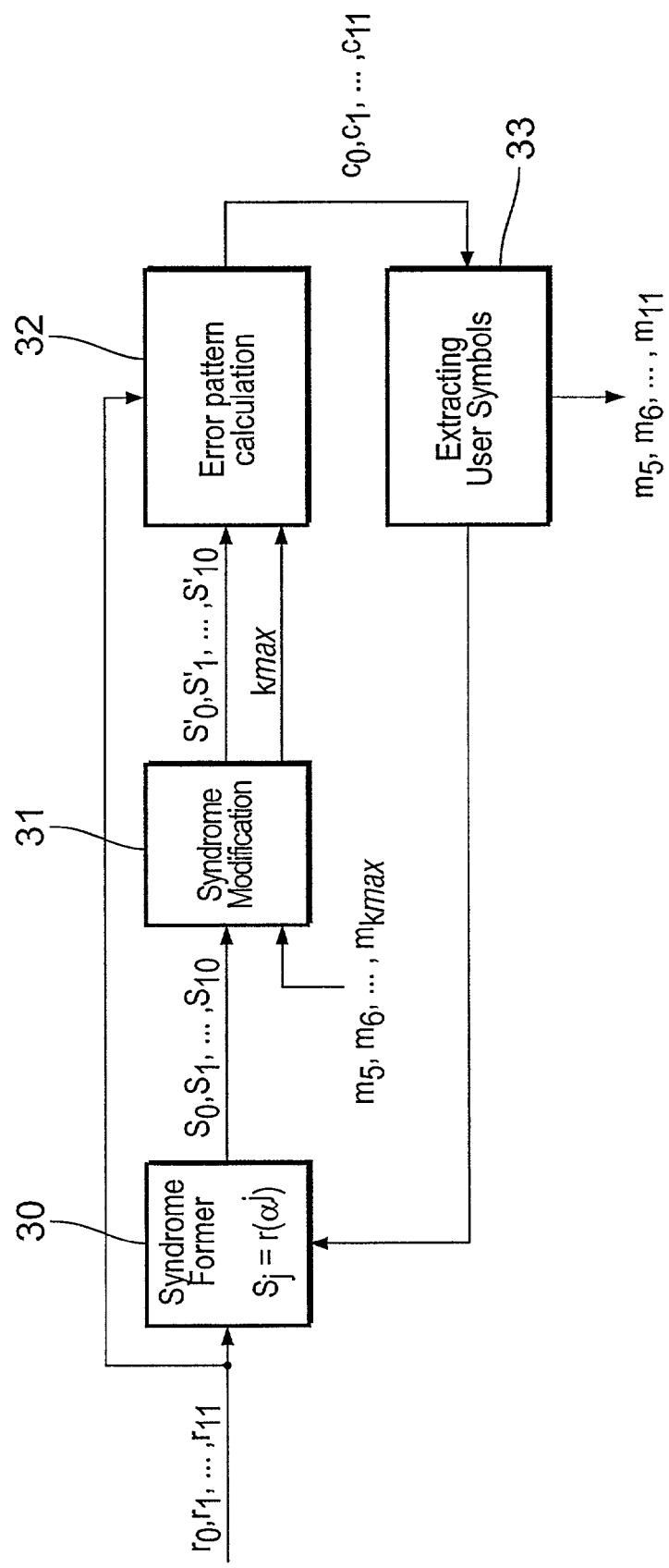
FIG. 7 shows an embodiment of an apparatus for decoding according to the invention.

Another preferred embodiment of the invention shall now be explained with reference to FIGS. 5 to 8. In FIGS. 5 and 6, two embodiments of an encoding apparatus according to the invention for frequency domain encoding are shown, in FIG. 7, a corresponding decoding apparatus is shown, and in FIG. 8, an extracting unit, which is part of the decoding apparatus of FIG. 7, is shown in more detail.

Frequency domain encoding and decoding shall be explained by way of the detailed example in the field of digital video recording (DVR). In the example, an address information, comprising 5 address symbols and 1 auxiliary symbol, together forming 6 information symbols, shall be encoded into a wobble code stored in a wobble signal. In the particular example, a [11, 6, 6] Reed-Solomon-like code over a Galois field GF (16) shall be used, wherein α is a primitive element. The codewords c are thus of the form $c(x)=c_0+c_1x+c_2x^2+\ldots+c_{10}x^{10}$. The 6 information symbols (also called user symbols) shall be labeled as $m_5, m_6, \ldots, m_{10}$, i.e., symbols $m_0$ to $m_4$ are not used in this particular example. A generator polynomial g(x) is given as:

$$g(x) = \prod_{i=0}^{4}(x - \alpha^i) = \sum_{i=0}^{5} g_i x^i.$$

If no information symbol is known to the decoder, said code has a minimum Hamming distance of six. However, if information symbol $m_5$ is known, the minimum Hamming distance is increased by one. With each additional successive information symbol known to the decoder, also the minimum Hamming distance is increased by one.

Before implementing the encoding rule, several definitions have to be made which will be explained in the following. A parent generator polynomial g(p)(x) is defined by:

$$g^{(p)}(x) = \prod_{i=0}^{10}(x - \alpha^i) = \sum_{i=0}^{11} g_i^{(p)} x^i.$$

Thereafter, for $5 \le i \le 10$, component generator polynomials g(i) are defined by:

$$g^{(i)}(x) = \beta_i g^{(i)},$$

wherein $$g^{(i)}(x) = g^{(p)}(x)/(x - \alpha^i)$$

$$\beta_i = [g^{(i)}(\alpha^i)]^{-1}.$$

The encoding rule for encoding a codeword c is then given by:

$$c(x) = \sum_{i=5}^{10} m_i g^{(i)}(x) = \left[\sum_{i=5}^{10} \frac{m_i \beta_i}{(x - \alpha^i)}\right] g^{(p)}(x).$$

The coefficients of said codeword polynomial c(x) then form the codeword c in the code C.

The implementation of this encoding rule using a feed-forward register is shown in FIG. 5. As can be seen therein, in a first portion, the information symbols $m_5$ to $m_{10}$ are, at first, multiplied with certain parameters, fed to respective feedback shift registers and then summed up. Thereafter, the sum is inputted to the feed-forward shift register, including the coefficients of the parent generator polynomial, to form the codeword polynomial c(x).

The general definitions for implementing a frequency domain encoding of an information word m, comprising k information symbols $m_{n-k}, m_{n-k+1}, \ldots, m_{n-1}$, into a codeword of an [n,k,n−k+1] Reed-Solomon code over GF(q) are as follows:

The parent generator polynomial ($g^{(p)}(x)$) is given as:

$$g^{(p)}(x) = \prod_{i=0}^{n-1}(x - \alpha^{i+b}),$$

wherein α is a non-zero element of GF(q) of order at most n, and b is an integer number. The component generator polynomials $g^{(i)}(x)$ for $n-k \le i \le n-1$ are defined by:

$$g^{(i)}(x) = \beta_i g^{(i)}(x),$$

wherein $$g^{(i)}(x) = g^{(p)}(x)/(x - \alpha^{i+b})$$

and $$\beta = [g^{(i)}(\alpha^{i+b})]^{-1}$$

hold. The codeword polynomial (c(x)) may be computed by:

$$c(x) = \sum_{i=n-k}^{n-1} m_i g^{(i)}(x),$$

wherein the coefficients of said codeword polynomial c(x) form the codeword c in the code C.

A slightly different embodiment of an encoding apparatus is shown in FIG. 6. Therein, the encoding rule for a [12, 7, 6]—code and for encoding 7 information symbols $m_5, m_6, \ldots, m_{11}$ into a codeword c(x) is implemented. The encoding rule for that specific example is now given by:

$$c(x) = \left[\sum_{i=5}^{10} m_i g^{(i)}(x)\right] + m_{11} g^{(p)}(x) = \left[\left\{\sum_{i=5}^{10} \frac{m_i \beta_i}{(x - \alpha^i)}\right\} + m_{11}\right] g^{(p)}(x).$$

The difference between the encoding rules of FIGS. 5 and 6 is that in the encoding rule of FIG. 6, the information symbol $m_{11}$ is directly used and that the encoding method implemented in the apparatus of FIG. 6 is a hybrid method of frequency and time domain encoding, while the encoding method implemented in the apparatus of FIG. 5 is a method for pure frequency domain encoding.

The general definitions for implementing the hybrid encoding of an information word m, comprising k information symbols $m_{n-k}, m_{n-k+1}, \ldots, m_{n-1}$, to a codeword of an [n,k,n−k+1] Reed-Solomon code over GF(q) are as follows:

The parent generator polynomial ($g^{(t)}(x)$) is given as:

$$g^{(t)}(x) = \prod_{i=0}^{n-2}(x-\alpha^{i+b}),$$

wherein $\alpha$ is a non-zero element of GF(q) of order at most n, and b is an integer number. The component generator polynomials $g^{(i)}(x)$ for $n-k \leq i \leq n-2$ are defined by:

$g^{(i)}(x) = \beta_i \tilde{g}^{(i)}(x)$ wherein $\tilde{g}^{(i)}(x) = g^{(t)}(x)/(x-\alpha^{i+b})$ and $\beta_i = [\tilde{g}^{(i)}(\alpha^{i+b})]^{-1}$ hold. The codeword polynomial (c(x)) may be computed by:

$$c(x) = \sum_{i=n-k}^{n-2} m_i g^{(i)}(x) + m_{n-1} g^{(t)}(x) = \left[\sum_{i=n-k}^{n-2} \frac{m_i}{(x-\alpha^{i+b})} + m_{n-1}\right] g^{(t)}(x),$$

wherein the coefficients of said codeword polynomial c(x) form the codeword c in the code C.

As can be seen from the above, in the examples, all component generator polynomials have the polynomial:

$$g(x) = \prod_{i=0}^{4}(x-\alpha^i)$$

in common. Therefore, the following properties of the parent and the component generator polynomials can be used for the extraction of the information symbols:

$g^{(p)}(\alpha^i) = 0, 5 \leq i \leq 10;$ $g^{(i)}(\alpha^i) = 1;$ $g^{(i)}(\alpha^j) = 0$ for $j \neq i$, $5 \leq i, j \leq 10$.

The information symbols $m_i$ can thus be extracted as follows:

$m_i = c(\alpha^i), 5 \leq i \leq 10, m_{11} = c_{11}.$

A corresponding decoding apparatus is shown in FIG. 7. Therein, it is assumed that a received word r(x), comprising symbols $r_0, r_1, \ldots, r_{11}$, is a possibly mutilated codeword, i.e., it includes a codeword c plus noise n. From the received word r, syndromes $S_j$ are computed according to a known method in a syndrome forming unit 30 wherein it holds that $S_j = c(\alpha^j) + n(\alpha^j) = n(\alpha^j)$ for $0 \leq j \leq 4$, and $S_j = n(\alpha^j) + m_j$ for $5 \leq j \leq 10$.

Under the assumption that $k_{max}-4$ information symbols $m_5, m_6, \ldots, m_{kmax}$ are known to the decoder prior to decoding, a contribution of the known information symbols $m_j$ can be removed from the computed syndromes $S_j$ for $5 \leq j \leq k_{max}$. According to the invention, the syndromes $S_j$ are therefore modified in a syndrome modification unit 31 to obtain additional (modified) syndromes $S'_j$.

For $0 \leq k \leq 4$, it holds that the syndromes are not modified, i.e., $S'_k = S_k$. However, for $5 \leq k \leq k_{max}$, the syndromes are modified by $S'_k = S_k - m_k$, i.e., each syndrome S for which a corresponding information symbol is known to the decoder, is modified. The obtained modified syndromes S' and the information about the number a priori known information symbols ($k_{max}$), are then inputted to an error pattern calculation unit 32 of a known type for calculating error locations and error values to obtain the coefficients $c_0, c_1, \ldots, c_{11}$ of the codeword c. In a practical realization, said error pattern calculation unit 32 may comprise a unit for solving a key equation and a unit for implementing a Chien search and Forney algorithm. As said before, $S'_k = S_k = n(\alpha^k)$ for $0 \leq k \leq 4$, and for $5 \leq k \leq k_{max}$, $S'_k = S_k - m_k = (n(\alpha^k) + m_k) - m_k = n(\alpha^k)$. Consequently, $S'_k = n(\alpha^k)$ for $0 \leq k \leq k_{max}$, which implies that, effectively, a code of minimum Hamming distance $k_{max}+2$ is used.

Finally, the obtained codeword coefficients $c_0, c_1, \ldots, c_{11}$ are used to extract all information symbols $m_5, m_6, \ldots, m_{11}$ in an extracting unit 33 wherein the information symbols are given by:

$m_i = c(\alpha^i), 5 \leq i \leq 10$, and $m_{11} = c_{11}$.

Figure 8:
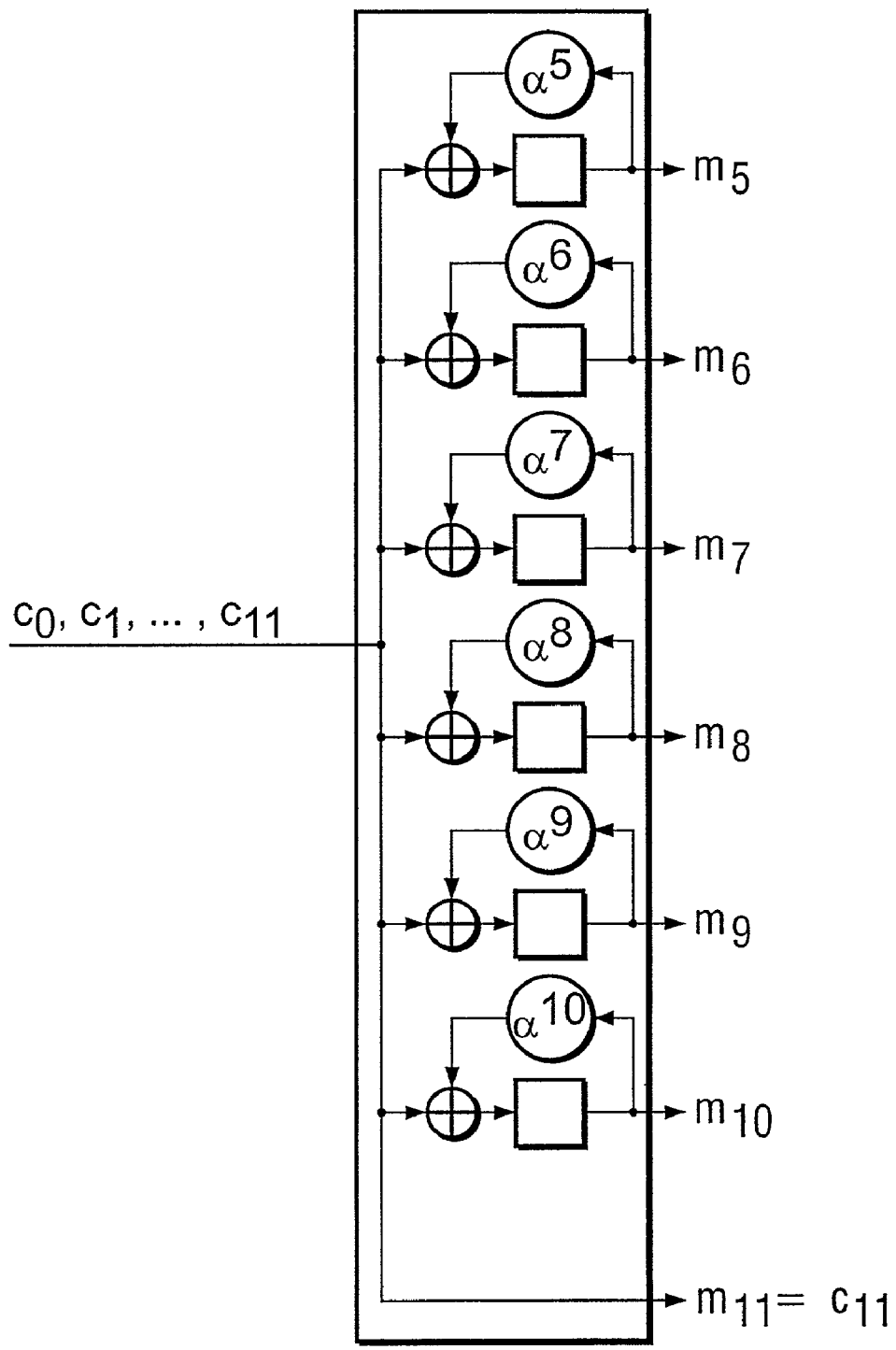
FIG. 8 shows means for extracting information symbols from a codeword used in the apparatus for decoding shown in FIG. 7.

A detailed embodiment of said extracting unit 33 is shown in FIG. 8.

As shown before, the Hamming distance of the described code increases to $k_{max}+2$ if information symbols $m_5, m_6, \ldots, m_{kmax}$ are known, thus enabling a more reliable address recognition. The increase in Hamming distance does not cost an extra redundancy and the decoder of the code might be a usual decoder which is capable of computing some extra syndromes. Knowledge of some information symbols thus allows the updating and subsequently use of the syndromes corresponding to these information symbols.

In more general terms, the syndromes $S_j$ are computed by:

$$S_j = \sum_{i=0}^{n-1} r_i \alpha^{i(j+b)} \text{ for } 0 \leq j \leq n-k-1,$$

and if the information symbols $m_{n-k}, m_{n-k+1}, \ldots, m_{n-k+s-1}$ are a priori known, said additional syndromes (S') are computed by:

$$S'_j = \sum_{i=0}^{n-1} r_i \alpha^{i(j+b)} - m_j \text{ for } n-k \leq j \leq n-k+s-1.$$

The information symbols may then be obtained by either:

$m_j = c(\alpha^{j+b})$ for $n-k \leq j \leq n-2$ and $m_{n-1} = c_{n-1}$ or $m_j = c(\alpha^{j+b})$ for $n-k \leq j \leq n-1$.

An example for a 3×5 generator matrix corresponding to frequency domain encoding shall now be given. For i=1, 2, 3, the i-th row of the generator matrix corresponds to a polynomial $f_i(x)$ of degree, at most, 4, such that $f_i(1) = f_i(\alpha) = 0$, $f_i(\alpha^{i-1}) = 1$, and for $1 \leq j \leq 3$, $f_i(\alpha^{j+1}) = 0$ if $i \neq j$. Herein, a is an element of GF(8) satisfying $\alpha^3=1+\alpha$. The following polynomials satisfy these requirements:

$$f_1(x)=\alpha^6+\alpha^6x+\alpha^3x^2+\alpha^2x^3+\alpha^5x^4$$

$$f_2(x)=\alpha^2+\alpha^2x^2+\alpha^2x^3+\alpha^2x^4$$

$$f_3(x)=\alpha^6+\alpha^5x+\alpha^5x^2+\alpha^2x^3+x^4.$$

This results in the generator matrix:

$$G = \begin{pmatrix} \alpha^6 & \alpha^6 & \alpha^3 & \alpha^2 & \alpha^5 \\ \alpha^2 & 0 & \alpha^2 & \alpha^2 & \alpha^2 \\ \alpha^6 & \alpha^5 & \alpha^5 & \alpha^2 & 1 \end{pmatrix}.$$

Figure 9:
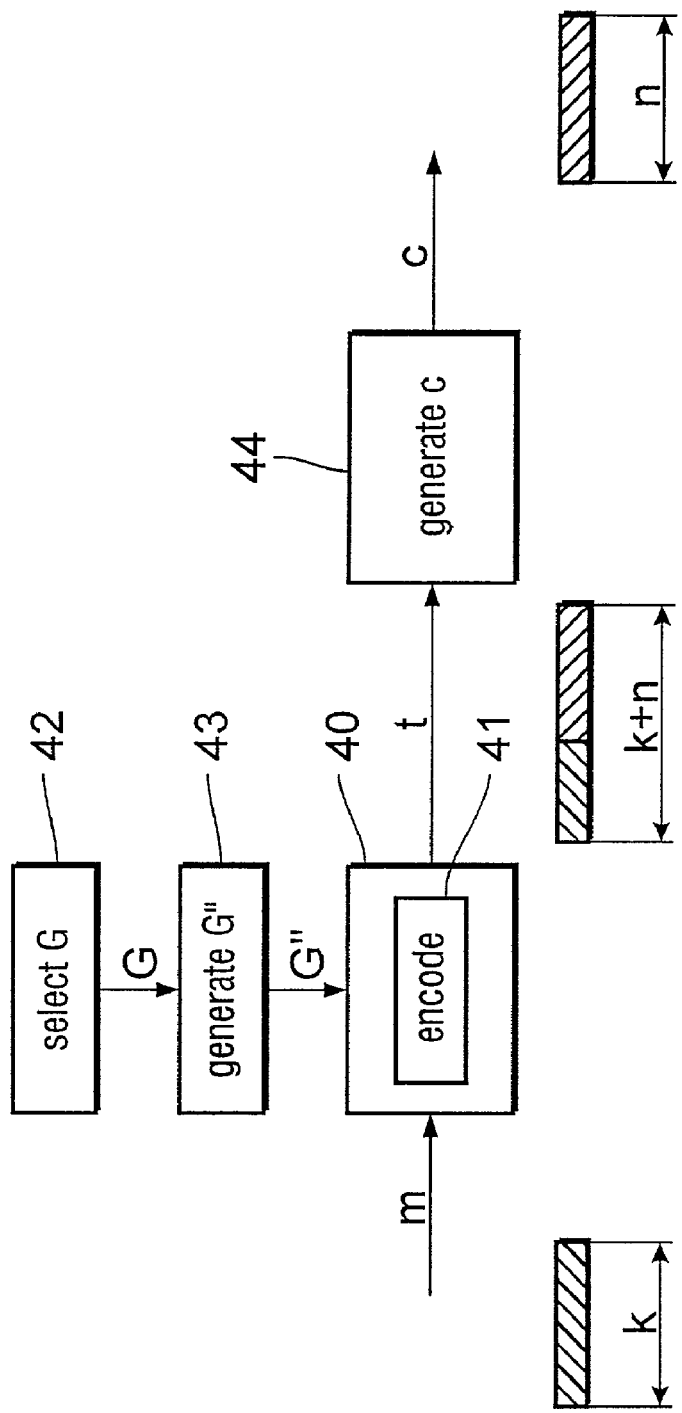
FIG. 9 shows still another embodiment of an apparatus for encoding according to the invention.

Yet another embodiment of the invention based on code puncturing shall now be explained with reference to FIGS. 9 and 10. FIG. 9 illustrates the method of encoding an information word m into a codeword c, and FIG. 10 illustrates the method of decoding a possibly mutilated codeword r into an information word m.

As shown in FIG. 9, the information word m, comprising k information symbols, is encoded by an encoding unit 41 of an encoding apparatus 40 using an intermediate generator matrix G". Said intermediate generator matrix G" is derived, in a generating unit 43, from a generator matrix G which has been selected by a selection unit 42. The intermediate generator matrix G" is larger than the generator matrix G, in that it comprises at least one more column than the generator matrix G. In general, the generator matrix G has k rows and n columns while the intermediate generator matrix G" has k rows and n+k columns, and comprises k columns with a single non-zero entry at mutually different positions. When using said intermediate generator matrix G" for encoding the information word m, intermediate codewords t having k+n symbols are obtained. From said intermediate codeword t, the codeword c is obtained from a codeword generating unit 44 by omitting a number of symbols of said intermediate codeword t. Therein, the number of symbols to omit corresponds to the difference between the number of columns of said intermediate generator matrix G" and said generator matrix G. Thus, the obtained codeword c comprises n symbols.

Figure 10:
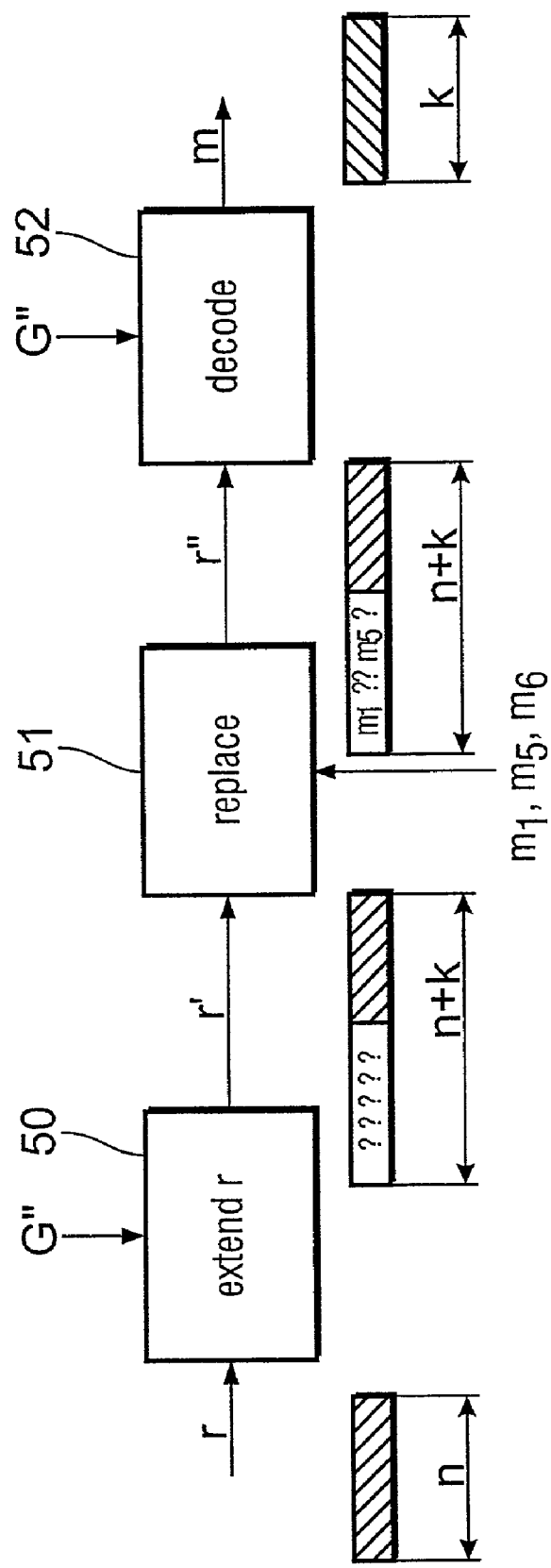
FIG. 10 shows a corresponding apparatus for decoding according to the invention.

During decoding, a possibly multilated codeword r comprising n symbols is received by a decoder as shown in FIG. 10. In a first step, the received word r is extended into a first pseudo codeword r' by an extension unit 50. Therein, said intermediate generator matrix G", which has already been used in the encoder, is used to determine the length of said pseudo codeword r', i.e., the number of symbols of said pseudo codeword r' corresponds to the number of columns of said intermediate generator matrix G", i.e., to the n symbols of the received word r, k erasures are added to obtain the pseudo codeword r'.

Thereafter, in a replacement unit 51, a priori known information symbols, e.g., $m_1$, $m_5$, $m_6$, are replaced in said pseudo codeword r' at positions of the erasures which correspond to the positions of said a priori known information symbols. This means that the erasures 1, 5 and 6 are replaced by the a priori known information symbols $m_1$, $m_5$, $m_6$. The obtained second pseudo codeword r" is thereafter inputted to a decoder unit 52, which is preferably a known error and erasure decoder, for decoding said second pseudo codeword r", by use of said intermediate generator matrix G", into the information word m comprising k symbols.

According to this embodiment of the invention, a larger intermediate generator matrix G" is used compared to other embodiments of the invention. However, the advantage of this embodiment is that the information symbols do not need to be known a priori in successive order, but any additional information symbol known a priori irrespective of the position of the information symbol within the information word generally leads to an enhanced minimum Hamming distance compared to the code used if no information symbols are known a priori.

The embodiment based on code puncturing shall now be illustrated differently. Considered is an [8, 3, 6] extended Reed-Solomon Code C over a Galois Field GF (8) defined as follows. The vector $c=(c_{-1}, c_0, c_1 \ldots, c_6)$ is in C if and only if:

$$c_{-1} = \sum_{i=0}^{6} c_i \text{ and } \sum_{i=0}^{6} c_i \alpha^{ij} = 0 \text{ for } 1 \le j \le 4.$$

Herein, $\alpha$ is an element of GF(8) satisfying $\alpha^3=1+\alpha$.

It can be seen that the following intermediate generator matrix G" generates the code C:

$$G'' = \begin{pmatrix} 1 & 0 & 0 & \alpha^2 & 1 & \alpha^6 & \alpha^2 & \alpha^6 \\ 0 & 1 & 0 & \alpha^3 & 1 & \alpha^3 & \alpha & \alpha \\ 0 & 0 & 1 & \alpha^4 & 1 & \alpha^5 & \alpha^5 & \alpha^4 \end{pmatrix}.$$

The rightmost 5 columns of the intermediate generator matrix G" are used as a generator matrix G, i.e., the generator matrix G is:

$$G = \begin{pmatrix} \alpha^2 & 1 & \alpha^6 & \alpha^2 & \alpha^6 \\ \alpha^3 & 1 & \alpha^3 & \alpha & \alpha \\ \alpha^4 & 1 & \alpha^5 & \alpha^5 & \alpha^4 \end{pmatrix}.$$

The code generated by the generator matrix G has minimum Hamming distance 3. Knowledge of any j information symbols effectively increases the minimum Hamming distance from 3 to 3+j.

The invention claimed is:

1. A method of selecting a generator matrix (G) for encoding information words (m), comprising information symbols ($m_1, m_2, \ldots, m_k$), into codewords (c) of a code (C) for providing an enhanced error correction capability if at least one information symbol ($m_1, m_2, m_3$) is known a priori to a decoder for decoding received, possibly mutilated codewords (r), characterized in that said method comprises the steps of:
   selecting said generator matrix (G) such that the minimum Hamming distance of at least one subcode (C') of said code (C) is larger than the minimum Hamming distance of said code (C); and
   deriving a subcode generator matrix (G') of said subcode (C') from said generator matrix (G) of said code (C) by omitting the at least one row from said generator matrix (G) corresponding to said at least one a priori known information symbol ($m_1, m_2, m_3$).

2. The method as claimed in claim 1, characterized in that said selecting step comprises selecting said generator matrix (G) such that there are at least two subcodes ($C_1'$, $C_2'$, $C_3'$) of respectively increasing Hamming distance, said at least two subcodes ($C_1'$, $C_2'$, $C_3'$) being nested in said code (C), and each subcode ($C_1'$, $C_2'$, $C_3'$) being generated by a corresponding subcode generator matrix ($G_1'$, $G_2'$, $G_3'$), wherein each subcode generator matrix ($G_1'$, $G_2'$, $G_3'$) has a different number of rows and all rows are part of said generator matrix (G).

3. The method as claimed in claim 2, characterized in that said subcode generator matrices ($G_1'$, $G_2'$, $G_3'$) include an increasing number of rows, wherein the number increases by one for each generator matrix ($G_1'$, $G_2'$, $G_3'$) and wherein the (i−1)-th subcode generator matrix ($G_1'$) is derived from the i-th subcode generator matrix ($G_2'$) by omitting one row.

4. The method as claimed in claim 3, characterized in that said generator matrix (G) is selected such that for all integer numbers i, i being an integer number equal to or larger than 1 but at most k−1 where k is the number of rows of said generator matrix (G), a number of i rows forms a subcode generator matrix ($G_i'$) for obtaining a subcode ($C_i'$) having a larger Hamming distance than a subcode ($C_{i+1}'$) obtained from a subcode generator matrix ($G_{i+1}'$) formed by a number of i+1 rows of said generator matrix (G).

5. The method as claimed in claim 1, characterized in that said generator matrix (G) is derived from a larger, intermediate generator matrix (G''), said intermediate generator matrix having at least one column more than said generator matrix (G) and generating a code having an increased minimum Hamming distance, by omitting said at least one column having a single non-zero entry.

6. The method as claimed in claim 5, characterized in that said generator matrix (G) has k rows and n columns, that said intermediate generator matrix (G''), having k rows and n+k columns, comprises k columns each with a single non-zero entry at mutually different positions, and that said generator matrix (G) is derived from said intermediate generator matrix (G'') by omitting said k columns.

7. A method of encoding information words (m), comprising information symbols ($m_1$, $m_2$, ..., $m_k$), into codewords (c) of a code (C) for providing an enhanced error correction capability if at least one information symbol ($m_1$, $m_2$, $m_3$) is known a priori to a decoder for decoding received, possibly mutilated codewords (r), characterized in that said method comprises the steps of:
  selecting a generator matrix (G) such that the minimum Hamming distance of at least one subcode (C') of said code (C) is larger than the minimum Hamming distance of said code (C); and
  encoding said information words (m) into said codewords (c) using said generator matrix (G).

8. The method as claimed in claim 7, wherein said method comprises the steps of:
  a) initializing a first codeword parameter ($c^1(x)$) with the first information symbol ($m_1$);
  b) calculating subsequent codeword parameters ($c^j(x)$) for j=2 to k:

$$c^j(x) = m_j + (x - \alpha a^{n-j}) c^{j-1}(x); \text{ and}$$

c) calculating the codeword polynomial (c(x))

$$c(x) = c^{k-1}(x) \cdot g_k(x) = \sum_{0 \leq i \leq n-1} c_i x^i,$$

wherein the coefficients ($c_i$) of said codeword polynomial (c(x)) form the codeword (c) in the code (C).

9. The method as claimed in claim 7, wherein an information word (m), comprising k information symbols ($m_{n-k}$, $m_{n-k+1}$, ..., $m_{n-1}$), is encoded to a codeword (c) of an [n, k, n−k+1] Reed-Solomon code over GF(q), said encoding comprising the steps of:
  a) defining a parent generator polynomial ($g^{(p)}(x)$):

$$g^{(p)}(x) = \prod_{i=0}^{n-1}(x - \alpha^{i+b}),$$

wherein $\alpha$ is a non-zero element of GF(q) of order at most n, and b is an integer number;
  b) defining component generator polynomials (g(i)) for n−k≤i≤n−1:

$$g^{(i)}(x) = \beta_i g^{(i)},$$

wherein $$g^{(i)}(x) = g^{(p)}(x)/(x - \alpha^{i+b})$$

and $$\beta_i = [g^{(i)}(\alpha^{i+b})]^{-1}; \text{ and}$$

c) computing the codeword polynomial (c(x)):

$$c(x) = \sum_{i=n-k}^{n-1} m_i g^{(i)}(x),$$

wherein the coefficients of said codeword polynomial (c(x)) form the codeword (c) in the code (C).

10. The method as claimed in claim 7, wherein an information word (m), comprising k information symbols ($m_{n-k}$, $m_{n-k+1}$, ..., $m_{n-1}$), is encoded to a codeword (c) of an [n, k, n−k+1] Reed-Solomon code over GF(q), said encoding comprising the steps of:
  defining a parent generator polynomial ($g^{(t)}(x)$):

$$g^{(t)}(x) = \prod_{i=0}^{n-2}(x - \alpha^{i+b}),$$

wherein $\alpha$ is a non-zero element of GF(q) of order at most n, and b is an integer number;
  defining component generator polynomials (g(i)) for n−k≤i≤n−2:

$$g^{(i)}(x) = \beta_i g^{(i)}(x)$$

wherein $$g^{(i)}(x) = g^{(t)}(x)/(x - \alpha^{i+b})$$

and $$\beta_i = [g^{(i)}(\alpha^{i+b})]^{-1}; \text{ and}$$

computing the codeword polynomial (c(x)):

$$c(x) = \left[\sum_{i=n-k}^{n-2} m_i g^{(i)}(x)\right] + m_{n-1} g^{(t)}(x).$$

wherein the coefficients of said codeword polynomial (c(x)) form the codeword (c) in the code (C).

11. The method as claimed in claim 7, wherein a generator matrix (G) selected and derived from an intermediate generator matrix (G") is used for encoding said information words (m) into said codewords (c), wherein said method comprises the steps of:
generating intermediate codewords (t) by encoding said information words (m) using said intermediate generator matrix (G"); and
generating said codewords (c) from said intermediate codewords (t) by omitting at least one symbol, wherein the number of symbols to omit corresponds to the difference between the number of columns of said intermediate generator matrix (G") and said generator matrix (G).

12. A method of decoding possibly mutilated codewords (r) of a code (C) into information words (m) comprising information symbols ($m_1, m_2, \ldots, m_k$), said information words (m) having been encoded into codewords (c) of said code (C) using a generator matrix (G) selected such that the minimum Hamming distance of at least one subcode (C') of said code (C) is larger than the minimum Hamming distance of said code (C), and said code (C) being provided with an enhanced error correction capability if at least one information symbol ($m_1, m_2, m_3$) is known a priori before decoding, characterized in that the contribution of said at least one a priori known information symbol ($m_1, m_2, m_3$) included in said possibly mutilated codeword (r) is taken into account for decoding said possibly mutilated codeword (r) with enhanced error correcting capabilities.

13. The method as claimed in claim 12, wherein said method further comprises the steps of:
encoding said a priori known information symbols ($m_1, m_2, m_3$) using the corresponding rows of said generator matrix (G) of said code (C);
accumulating the results of the encoding step thereby forming an intermediate word (s);
subtracting said intermediate word (s) from said possibly mutilated codeword (r) to be decoded;
decoding the result of said subtraction by a known method for decoding the code generated by the rows of the generator matrix (G) that do not correspond to said a priori known information symbols; and
recovering the information word (m).

14. The method as claimed in claim 12, wherein said method further comprises the steps of:
forming syndromes (S) from a received, possibly mutilated codeword (r);
forming additional syndromes (S') using said a priori known information symbols ($m_5, m_6, \ldots, m_{kmax}$) and said possibly mutilated codeword (r); and
calculating the information word (m) using said syndromes (S) and additional syndromes (S').

15. The method as claimed in claim 14, wherein the information word (m) is calculated by the steps of:
calculating error locations and error values using said syndromes (S) and additional syndromes (S') to obtain the codeword (c); and
extracting the information word (m) from said obtained codeword (c).

16. The method as claimed in claim 15, wherein the information words (m) are encoded into said codewords (c), wherein said syndromes (S) are computed as:

$$S_j = \sum_{i=0}^{n-1} r_i \alpha^{i(j+b)} \text{ for } 0 \le j \le n-k-1,$$

wherein said additional syndromes (S') are computed as:

$$S'_j = \sum_{i=0}^{n-1} r_i \alpha^{i(j+b)} - m_j \text{ for } n-k \le j \le n-k+s-1,$$

wherein $m_{n-k}, m_{n-k+1}, \ldots, m_{n-k+s-1}$ are the known a priori information symbols, and
wherein said information words (m) are extracted from said obtained codewords by $m_j = c(\alpha^{j+b})$ for $n-k \le j \le n-1$.

17. The method as claimed in claim 15, wherein the information words (m) are encoded into said codewords (c), wherein said syndromes (S) are computed as:

$$S_j = \sum_{i=0}^{n-1} r_i \alpha^{i(j+b)} \text{ for } 0 \le j \le n-k-1,$$

wherein said additional syndromes (S') are computed as:

$$S'_j = \sum_{i=0}^{n-1} r_i \alpha^{i(j+b)} - m_j \text{ for } n-k \le j \le n-k+s-1,$$

wherein $m_{n-k}, m_{n-k+1}, \ldots, m_{n-k+s-1}$ are the known a priori information symbols, and wherein said information words (m) are extracted from said obtained codewords by $m_j = c(\alpha^{j+b})$ for $n-k \le j \le n-2$ and $m_{n-1} = c_{n-1}$.

18. The method as claimed in claim 12, wherein a generator matrix (G) selected and derived from an intermediate generator matrix (G") is used for encoding said information words (m) into said codewords (c), and wherein the method further comprises the steps of:
extending said possibly mutilated codeword (r) to a pseudo codeword (r') by adding erasures at positions corresponding to said columns that have been omitted in said intermediate generator matrix (G") to obtain said generator matrix (G);
replacing the erasures at positions corresponding to said a priori known information symbols ($m_1, m_2, m_3$) by said a priori known information symbols to obtain a second pseudo codeword (r"); and
decoding said second pseudo codeword (r") by a known method for error and erasure decoding of a code generated by said intermediate generator matrix (G").

19. The method as l claimed in claim 1, characterized in that said information words (m) comprise data items wherein successive information words have predetermined corresponding data item elements such that knowledge of a first information word comprising a first data item leads to knowledge of data item elements of one or more successive data items included in subsequent information words.

20. The method as claimed in claim 19, characterized in that said information words (m) comprise address information of positions in a serial data stream and/or of positions on a data carrier.

21. The method as claimed in claim 20, characterized in that said method is applied in digital video recording for encoding an address information into a wobble code to be stored on a data carrier in a wobble signal.

22. The method as claimed in claim 20, characterized in that said information words (m) of said address information comprise multi-bit information symbols.

23. An apparatus for encoding information words (m) comprising information symbols ($m_1$, $m_2$, . . . , $m_k$) into codewords (c) of a code (C) for providing an enhanced error correction capability if at least one information symbol ($m_1$, $m_2$, $m_3$) is known a priori to a decoder for decoding received, possibly mutilated codewords (r), said apparatus comprising:
  means for selecting a generator matrix such that the minimum Hamming distance of at least one subcode (C') of said code (C) is larger than the minimum Hamming distance of said code (C); and
  means for encoding said information words (m) into said codewords (c) using said generator matrix (G).

24. An apparatus for decoding possibly mutilated codewords (r) of a code (C) into information words (m) comprising information symbols ($m_1$, $m_2$, . . . , $m_k$), said information words (m) having been encoded into codewords (c) of said code (C) using a generator matrix (G) selected such that the minimum Hamming distance of at least one subcode (C') of said code (C) is larger than the minimum Hamming distance of said code (C), and said code (C) being provided with an enhanced error correction capability if at least one information symbol ($m_1$, $m_2$, $m_3$) is known a priori before decoding, said apparatus comprising:
  means for taking the contribution of said at least one a priori known information symbol ($m_1$, $m_2$, $m_3$) included in said possibly mutilated codeword (r) into account for decoding said possibly mutilated codeword (r) with enhanced error correcting capabilities.

25. A computer program for implementing a method of selecting a generator matrix (G) for encoding information words (m), comprising information symbols ($m_1$, $m_2$ . . . , $m_k$), into codewords (c) of a code (C) for providing an enhanced error correction capability if at least one information symbol ($m_1$, $m_2$, $m_3$) is known a priori to a decoder for decoding received, possibly mutilated codewords (r), characterized in that said method comprises the steps of:
  selecting said generator matrix (G) such that the minimum Hamming distance of at least one subcode (C') of said code (C) is larger than the minimum Hamming distance of said code (C); and
  deriving a subcode generator matrix (G') of said subcode (C') from said generator matrix (G) of said code (C) by omitting the at least one row from said generator matrix (G) corresponding to said at least one a priori known information symbol ($m_1$, $m_2$, $m_3$).

26. A data carrier for recording user data, said data carrier having stored system data items encoded by a method of encoding information words (m), comprising information symbols ($m_1$, $m_2$, . . . , $m_k$), into codewords (c) of a code (C) for providing an enhanced error correction capability if at least one information symbol ($m_1$, $m_2$, $m_3$) is known a priori to a decoder for decoding received, possibly mutilated codewords (r), characterized in that said method comprises the steps of:
  selecting a generator matrix (G) such that the minimum Hamming distance of at least one subcode (C') of said code (C) is larger than the minimum Hamming distance of said code (C); and
  encoding said information words (m) into said codewords (c) using said generator matrix (G).

27. The data carrier as claimed in claim 26, wherein said system data items comprise address data and/or timing data used for finding a position on said data carrier.

28. A signal for transmitting user data, said signal including system data items encoded by a method of encoding information words (m), comprising information symbols ($m_1$, $m_2$, . . . , $m_k$) into codewords (c) of a code (c) for providing an enhanced error correction capability if at least one information symbol ($m_1$, $m_2$, $m_3$) is known a priori to a decoder for decoding received, possibly mutilated codewords (r), characterized in that said method comprises the steps of:
  selecting a generator matrix (G) such that the minimum Hamming distance of at least one subcode (C') of said code (C) is larger than the minimum Hamming distance of said code (C); and
  encoding said information words (m) into said codewords (c) using said generator matrix (G).

* * * * *